United States Patent
Chuah et al.

(10) Patent No.: US 11,696,409 B2
(45) Date of Patent: Jul. 4, 2023

(54) VERTICAL EMBEDDED COMPONENT IN A PRINTED CIRCUIT BOARD BLIND HOLE

(71) Applicant: Intel Corporation, Santa Clara, CA (US)

(72) Inventors: Tin Poay Chuah, Banyan Lepas (MY); Min Suet Lim, Bayan Lepas (MY); Hoay Tien Teoh, Paya Terubong (MY); Mooi Ling Chang, Bayan Baru (MY); Chin Lee Kuan, Bayan Lepas (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/325,659

(22) PCT Filed: Sep. 30, 2016

(86) PCT No.: PCT/US2016/054643
§ 371 (c)(1),
(2) Date: Feb. 14, 2019

(87) PCT Pub. No.: WO2018/063279
PCT Pub. Date: Apr. 5, 2018

(65) Prior Publication Data
US 2019/0208643 A1 Jul. 4, 2019

(51) Int. Cl.
*H05K 1/18* (2006.01)
*H05K 1/11* (2006.01)
*H05K 1/16* (2006.01)

(52) U.S. Cl.
CPC .............. *H05K 1/184* (2013.01); *H05K 1/111* (2013.01); *H05K 1/113* (2013.01); *H05K 1/16* (2013.01);
(Continued)

(58) Field of Classification Search
CPC .... H05K 3/0035; H05K 3/341; H05K 3/4038; H05K 3/4061; H05K 3/4069;
(Continued)

(56) References Cited

U.S. PATENT DOCUMENTS 3,784,878 A * 1/1974 Neu ................. H05K 1/145
361/761
6,153,290 A * 11/2000 Sunahara ............ H01L 21/4857
156/89.16
(Continued)

FOREIGN PATENT DOCUMENTS

| JP | 2001-156211 | 6/2001 | |
|---|---|---|---|
| JP | 2002299813 A | * 10/2002 | ............... H05K 1/18 |
| KR | 10-0714196 | 5/2007 | |

OTHER PUBLICATIONS

International Preliminary Report on Patentability for International Patent Application No. PCT/US2016/054643, dated Apr. 11, 2019, 9 pgs.
(Continued)

*Primary Examiner* — Paresh Paghadal
(74) *Attorney, Agent, or Firm* — Schwabe, Williamson & Wyatt P.C.

(57) ABSTRACT

A printed circuit board (PCB) comprises a blind via and a discrete component vertically embedded within the blind via.

14 Claims, 9 Drawing Sheets

(52) U.S. Cl.
CPC ............. *H05K 1/162* (2013.01); *H05K 1/165* (2013.01); *H05K 1/167* (2013.01); *H05K 1/183* (2013.01); *H05K 2201/0305* (2013.01); *H05K 2201/09072* (2013.01); *H05K 2201/10454* (2013.01)

(58) Field of Classification Search
CPC .... H05K 3/4084; H05K 3/4092; H05K 1/184; H05K 2203/0126; H05K 2203/1438; H05K 2201/09072; H05K 2201/10454
See application file for complete search history.

(56) References Cited

U.S. PATENT DOCUMENTS

| | | | | |
|---|---|---|---|---|
| 6,809,268 | B2 * | 10/2004 | Hayashi | H01L 23/49894 174/260 |
| 6,975,517 | B1 * | 12/2005 | Kwong | H05K 1/16 361/763 |
| 7,570,493 | B2 * | 8/2009 | Karlsson | H05K 1/115 174/264 |
| 7,782,629 | B2 * | 8/2010 | Graydon | H05K 1/184 174/262 |
| 7,891,980 | B2 * | 2/2011 | Frasco | H05K 1/023 439/65 |
| 8,198,547 | B2 * | 6/2012 | Hardin | H05K 1/184 174/260 |
| 8,207,811 | B2 * | 6/2012 | Mano | H01F 17/0006 336/200 |
| 8,279,616 | B2 * | 10/2012 | Kim | H05K 1/0231 174/261 |
| 9,368,468 | B2 * | 6/2016 | Stuber | H01L 24/03 |
| 9,601,545 | B1 * | 3/2017 | Tu | H01L 21/76895 |
| 9,949,381 | B2 * | 4/2018 | Auchere | H01L 23/49822 |
| 10,014,843 | B2 * | 7/2018 | Hurwitz | H01L 27/016 |
| 2002/0100611 | A1 * | 8/2002 | Crockett | H05K 1/0231 174/261 |
| 2002/0191366 | A1 * | 12/2002 | Naito | H01L 23/66 361/302 |
| 2003/0087498 | A1 * | 5/2003 | Galvagni | H01L 23/49822 438/381 |
| 2004/0165361 | A1 * | 8/2004 | Kimura | H01L 23/5383 361/763 |
| 2005/0244999 | A1 * | 11/2005 | Masuyama | H05K 1/167 438/106 |
| 2006/0133056 | A1 * | 6/2006 | Wyrzykowska | H05K 1/023 361/763 |
| 2007/0013068 | A1 * | 1/2007 | Ranade | H01L 21/4857 257/738 |
| 2007/0222084 | A1 * | 9/2007 | Hall | H01L 23/49838 257/E23.07 |
| 2008/0202799 | A1 * | 8/2008 | Graydon | H05K 1/184 29/830 |
| 2009/0175012 | A1 * | 7/2009 | Frasco | H05K 1/184 361/762 |
| 2010/0112826 | A1 * | 5/2010 | Frasco | H05K 1/023 439/82 |
| 2010/0163291 | A1 | 7/2010 | Cho et al. | |
| 2013/0122658 | A1 * | 5/2013 | Savic | H01L 23/3107 438/126 |
| 2013/0170154 | A1 * | 7/2013 | Lee | H05K 3/4602 361/748 |
| 2014/0146499 | A1 * | 5/2014 | Jang | H05K 1/162 361/761 |
| 2014/0247570 | A1 * | 9/2014 | Wang | H05K 1/186 29/837 |
| 2014/0268613 | A1 * | 9/2014 | Russell | H01L 23/49838 361/767 |
| 2017/0118842 | A1 * | 4/2017 | Chamberlin | H05K 3/3447 |
| 2017/0179067 | A1 * | 6/2017 | Aoki | H05K 3/3436 |
| 2017/0290162 | A1 * | 10/2017 | Gomez | H05K 1/181 |
| 2017/0367176 | A1 * | 12/2017 | Shan | H05K 1/0231 |
| 2018/0084648 | A1 * | 3/2018 | Miyawaki | H05K 1/186 |
| 2019/0166694 | A1 * | 5/2019 | Ito | H05K 1/185 |

OTHER PUBLICATIONS

International Search Report and Written Opinion for International Patent Application No. PCT/US2016/054643 dated May 23, 2017, 12 pgs.

* cited by examiner

VERTICAL EMBEDDED COMPONENT IN A PRINTED CIRCUIT BOARD BLIND HOLE

CROSS-REFERENCE TO RELATED APPLICATION

This patent application is a U.S. National Phase Application under 35 U.S.C. § 371 of International Application No. PCT/US2016/054643, filed Sep. 30, 2016, entitled "VERTICAL EMBEDDED COMPONENT IN A PRINTED CIRCUIT BOARD BLIND HOLE," which designates the United States of America, the entire disclosure of which is hereby incorporated by reference in its entirety and for all purposes.

FIELD

The present disclosure generally relates to printed circuit boards (PCBs).

BACKGROUND

Decoupling capacitors are often mounted at the edge of an integrated circuit (IC) and/or on the bottom side of a PCB to decouple various circuits on the PCB. In such applications power decoupling is enhanced as the capacitors become closer in proximity to a power/ground pin/ball of the IC package.

DETAILED DESCRIPTION

In the following description, numerous specific details are set forth in order to provide a thorough understanding of various embodiments. However, various embodiments of the invention may be practiced without the specific details. In other instances, well-known methods, procedures, components, and circuits have not been described in detail so as not to obscure the particular embodiments of the invention.

Figure 1:
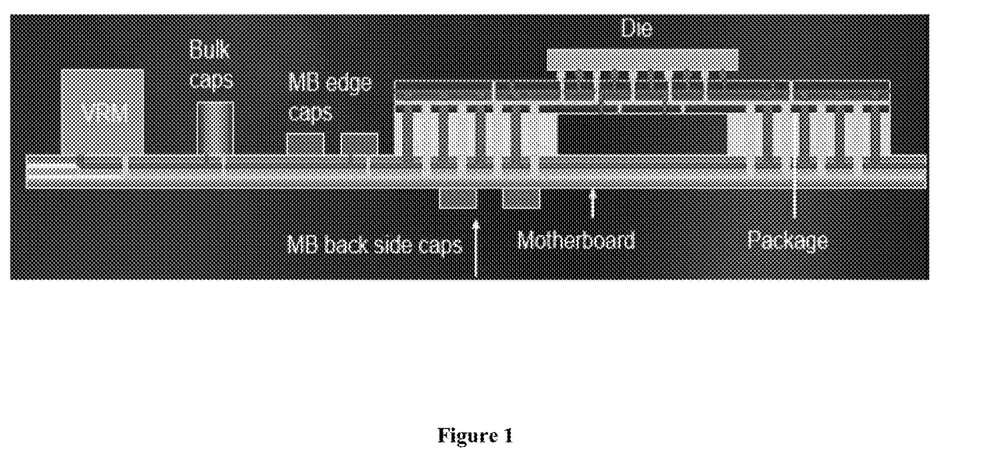
FIG. 1 illustrates conventional on board decoupling placement.

FIG. 1 illustrates a motherboard implementing a conventional decoupling implementation. As shown in FIG. 1, the motherboard includes edge capacitors mounted at the motherboard at the edge of a CPU package, and backside (or bottom side) capacitors mounted on the motherboard underneath the CPU package. As discussed above, power decoupling is most effective the closer the capacitors are to the power/ground pin/ball of the package. Thus, decoupling is optimum in implementations in which the capacitors are embedded within the motherboard. However, existing embedded applications require complicated, costly and advanced board processing.

Figure 2:
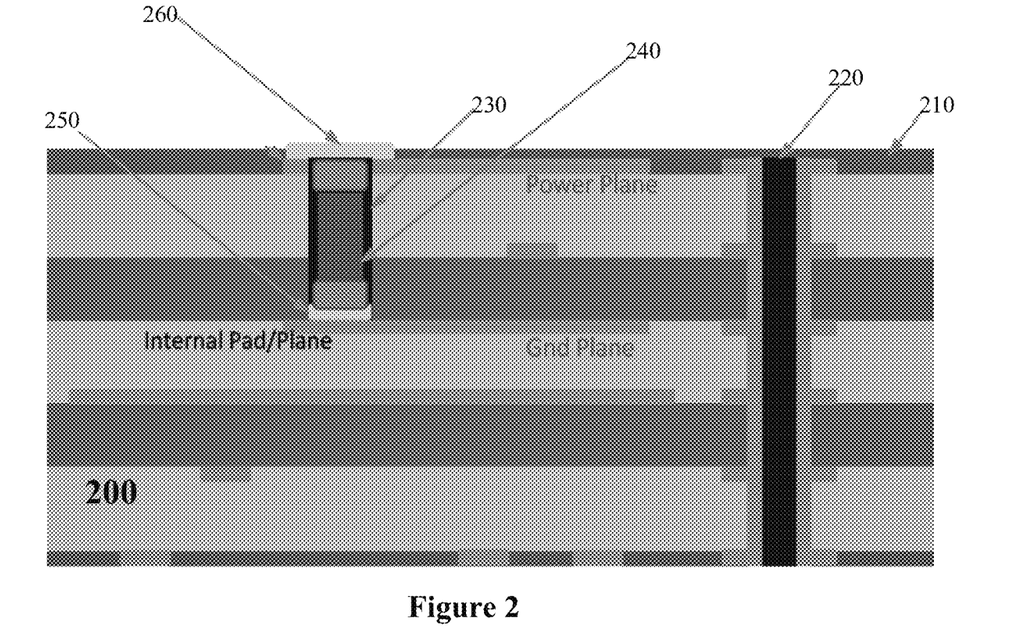
FIG. 2 illustrates one embodiment of a component vertically embedded within a PCB.
Figure 3:
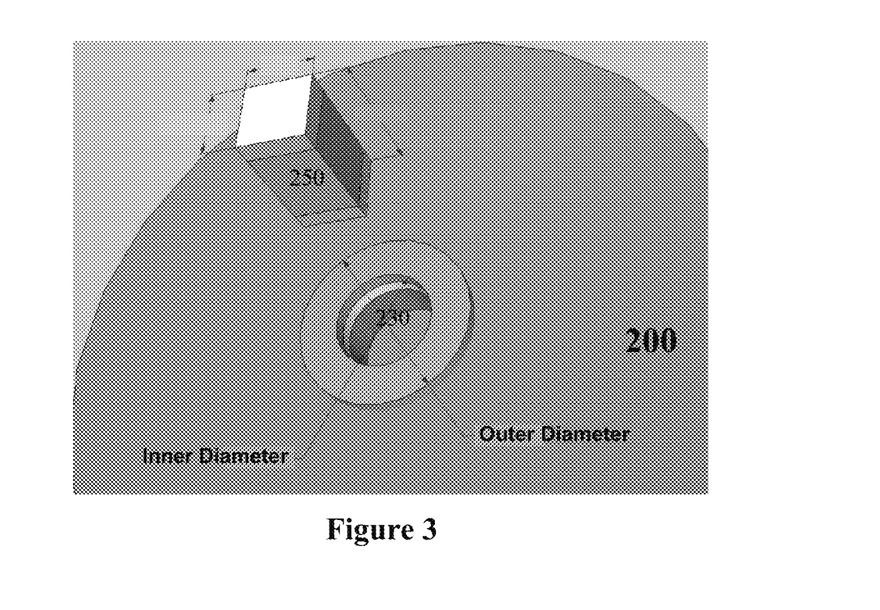
FIG. 3 illustrates one embodiment of a component to be embedded in a blind via.

According to one embodiment, a PCB blind via process is implemented to vertically accommodate discrete components (e.g., a capacitor), resulting in more efficient use of total PCB area. A blind via connects one outer layer with one or more inner layers of a PCB. In a further embodiment, the component is vertically embedded under a ball grid array coupled between an IC package and the PCB. FIG. 2 illustrates one embodiment of a PCB 200 having a capacitor 240 vertically embedded in a blind via 230. In a further embodiment, capacitor 240 is mounted between a conductive pad (e.g., paste or adhesive) 250 and a solder paste pad 270. FIG. 3 illustrates one embodiment of a capacitor 250 to be embedded into blind via 230. In one embodiment, capacitor 250 has a dimension of 0.2×0.2×0.4 mm to be plugged into a 0.3 mm blind via 230 having a depth of 0.4-0.5 mm. Referring back to FIG. 2, PCB 200 also includes a solder mask 210, a plated through via 220.

Figure 4:
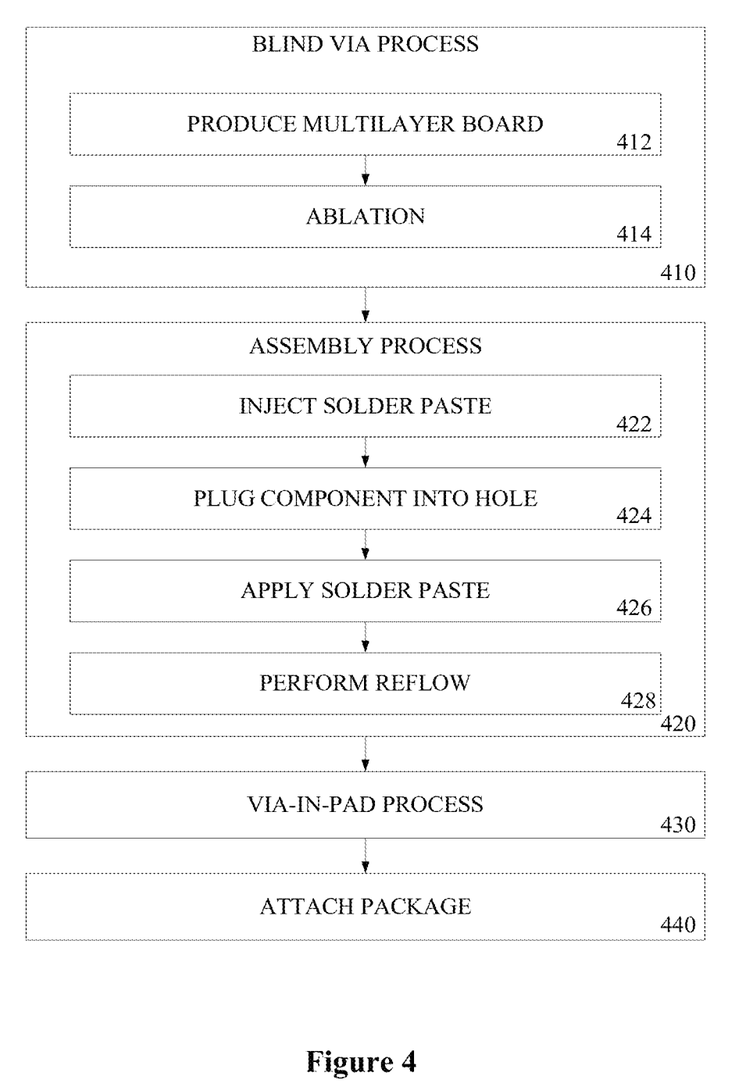
FIG. 4 is a flow diagram illustrating one embodiment of a process for vertically embedding a component within a PCB.

FIG. 4 is a flow diagram illustrating one embodiment of a process for vertically embedding a component, such as capacitor 240 within a blind via 230 at PCB 200. In this embodiment, PCB includes a top layer, bottom layer and layers L2-L5 in between. Prior to performing the process, the depth of blind via 230 is pre-determined and arranged accordingly with respect to the component length during the PCB 200 layer stack up planning to ensure the component's terminal fall on top of an internal landing pad/plane at one side and flat to the PCB surface 200 at the other side of the terminal.

Figure 5A:
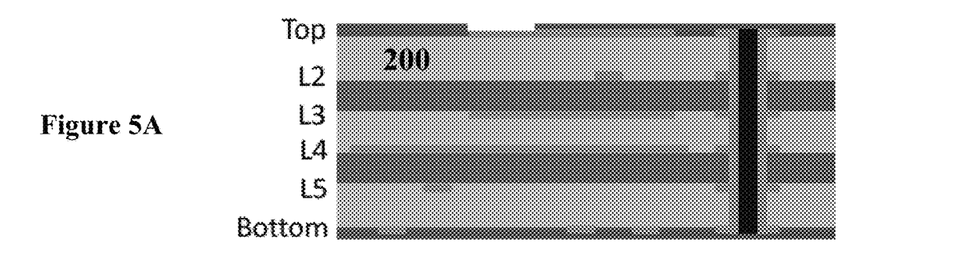
FIGS. 5A-5H illustrate embodiments of a PCB during the process for vertically embedding a component within a PCB.
Figure 5B:
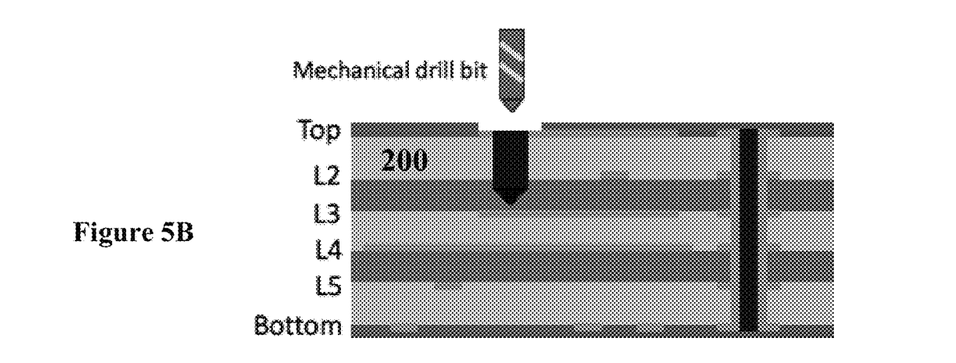
Figure 5C:
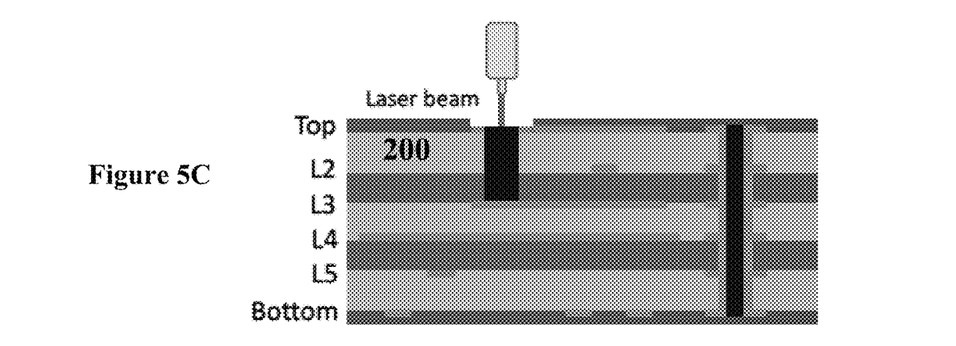

At processing block 410, a blind via process is performed on PCB 200. In one embodiment, the blind via process is performed by producing a multilayer board (e.g., type 3 or type 4) at processing block 412. FIG. 5A illustrates one embodiment of PCB 200 after producing the multilayer board. Subsequently, an a ablation process is performed, at processing block 414, to produce blind via 230 depth at an internal landing pad/plane of PCB 200. In one embodiment, the ablation process comprises performing a direct laser ablation. However other embodiments may include a combination of a mechanical drill with laser ablation. FIG. 5B illustrates one embodiment of using a mechanical drill on PCB 200 to create a hole stopping at layers L2-L3. FIG. 5C illustrates one embodiment of performing a laser ablation on PCB 200 with a laser stop at L3.

Figure 5D:
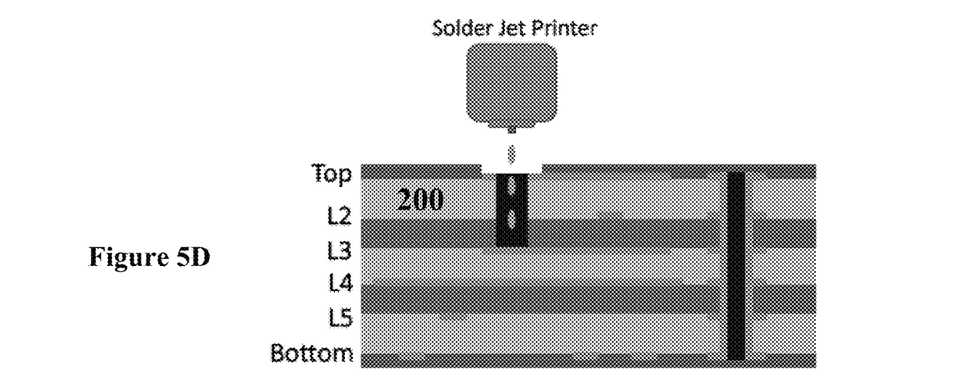
Figure 5E:
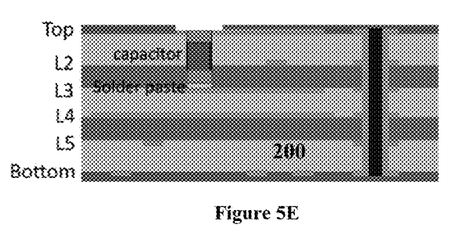
Figure 5F:
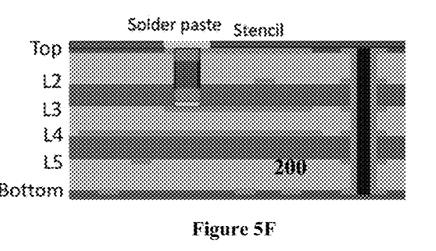
Figure 5G:
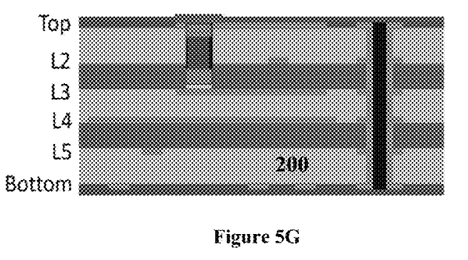

At processing block 420, an assembly process is performed on PCB 200. In one embodiment, the assembly process includes injecting a solder paste into via 230, processing block 422. In one embodiment, the solder paste is injected using a solder jet printer to precisely control the location and amount of solder paste to be injected to the internal soldering pad. FIG. 5D illustrates one embodiment of solder jet printer being implemented to inject a solder paste into PCB 200. At processing block 424, the component (e.g., capacitor 240) is plugged into via 230. FIG. 5E illustrates one embodiment of mounting the component in via 230. At processing block 426, a solder paste is applied on the top layer of PCB 200. In one embodiment, the solder paste is sprayed on PCB 200 using a stencil. However in another embodiment, the solder paste may be sprayed on using a jet printer. FIG. 5F illustrates one embodiment of PCB after the solder paste has been applied. At processing block 428, a final reflow is performed on PCB 200 to permanently attach the component to PCB 200. FIG. 5G illustrates one embodiment of PCB 200 after the reflow process has been completed.

Figure 5H:
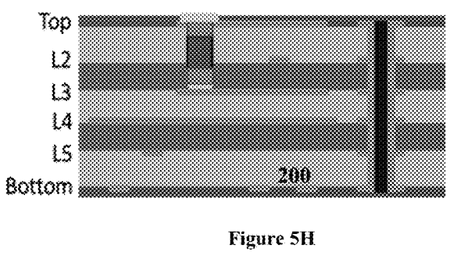
Figure 6:
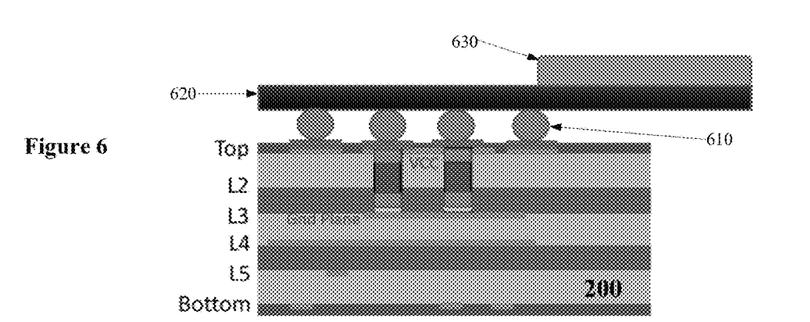
FIG. 6 illustrates one embodiment of an IC package mounted on a PCB.

At processing block 430, a via-in-pad process is performed upon completion of PCB 200 in order to produce a flat pad 260 surface. FIG. 5H illustrates one embodiment of PCB 200 after via-in-pad processing has been performed. At processing block 440, an IC package 620 having a die 630 is attached to PCB 200 using a BGA 610. FIG. 6 illustrates one embodiment of vertically embedded components directly under a BGA package.

Figure 7:
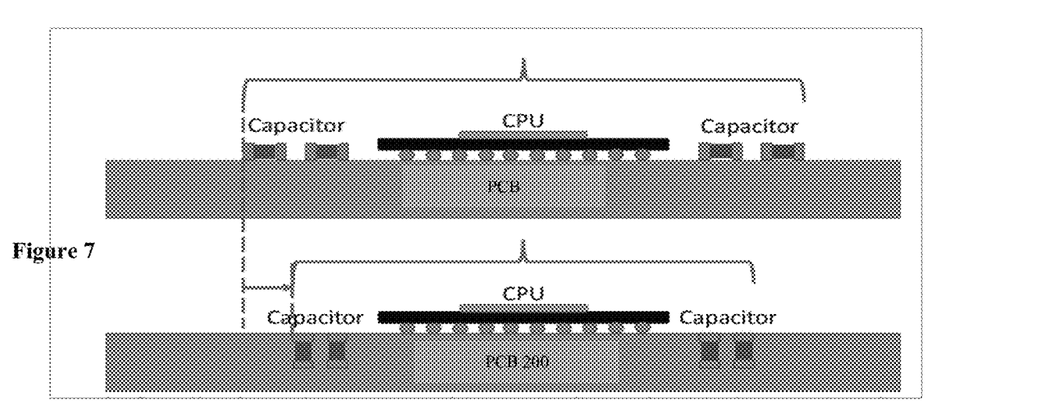
FIG. 7 illustrates a comparison of a conventional decoupling solution and a component vertically embedded within a PCB.

FIG. 7 illustrates a comparison of a conventional decoupling solution and a component vertically embedded within PCB 200. As shown in FIG. 7, the conventional decoupling mechanism with edge cap solution requires a larger area for component mounting on the PCB surface. However, the vertically embedded component in the blind via of PCB reduces total area, while improving the decoupling loop inductance.

Figure 8A:
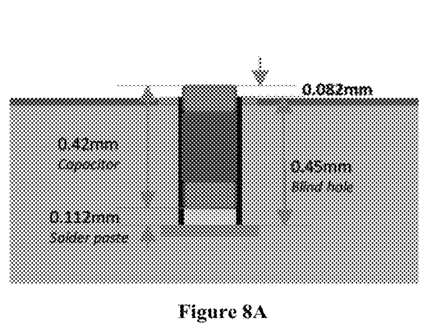
FIGS. 8A & 8B illustrate z height tolerance control.
Figure 8B:
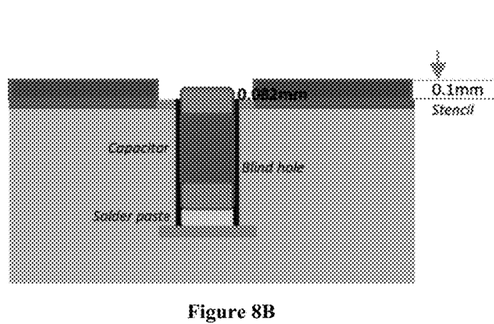

FIG. 8A illustrates one embodiment of an overall highest dimension (or worst-case) z stack for PCB 200, where an embedded component capacitor is protruded out by 0.082 mm from the PCB 200 surface. This is well within the standard stencil printing thickness of 0.1 mm, as shown in FIG. 8B.

Figure 9:
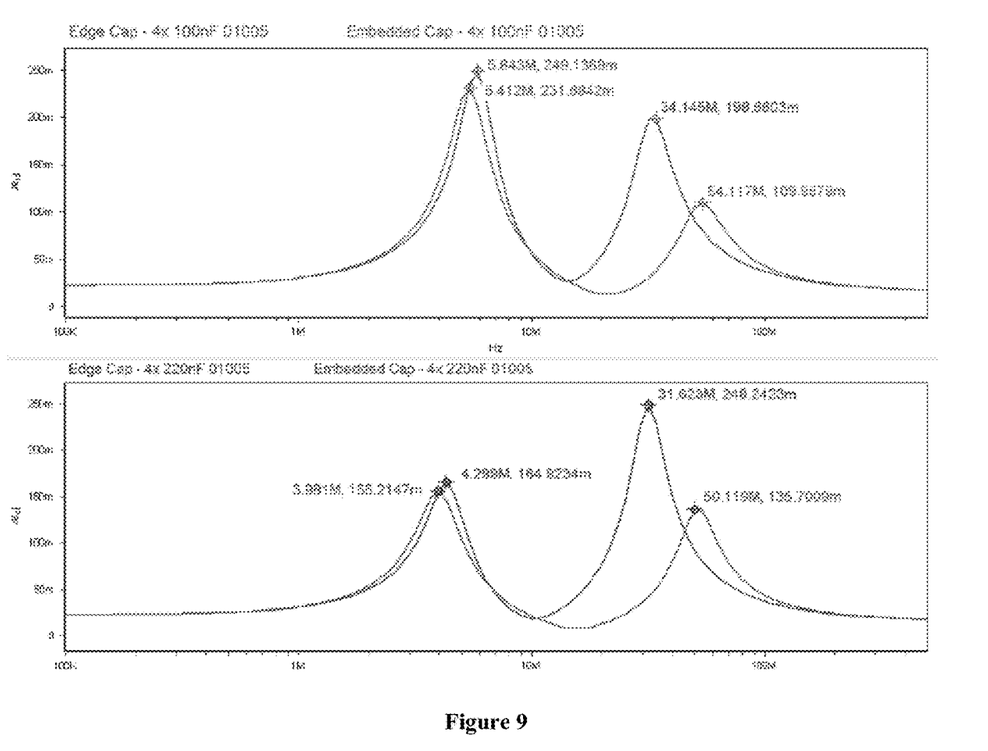
FIG. 9 illustrates simulation comparisons of a conventional decoupling solution and a component vertically embedded within a PCB.

With regards to power integrity improvement, the embedded capacitors result in significantly smaller loop inductance to package flip chip (or C4) bumps than the conventional board edge capacitor solution. FIG. 9 illustrates one embodiment of simulation comparisons of a conventional decoupling solution and a component vertically embedded within a PCB. The presently disclosed embedded capacitor has a 65% smaller loop inductance as compared to the conventional edge capacitor, which translates to 7% reduction on 2nd-peak at 4-5 MHz and a 45% reduction on 1st-peak at 30-50 MHz.

Figure 10:
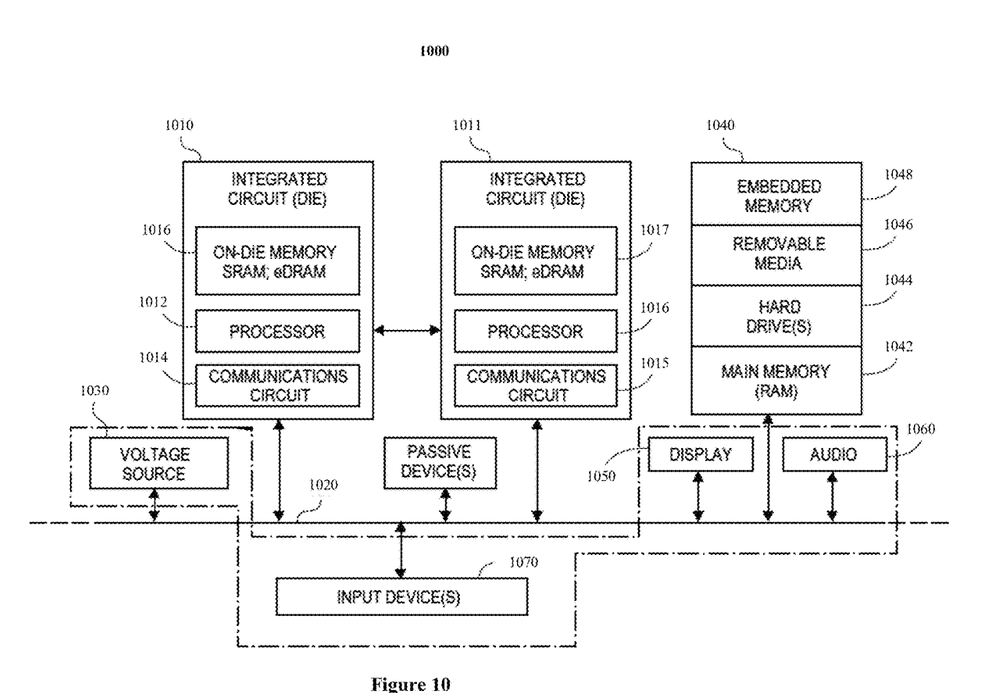
FIG. 10 illustrates a system in which a high Q capacitor may be implemented.

FIG. 10 illustrates one embodiment of a computer system 1000 in which PCB 200 may be implemented. The computer system 1000 (also referred to as the electronic system 1000) as depicted can embody a semiconductor die packaged with one or more ACIs having metal-density layer units of fractal geometry according to any of the several disclosed embodiments and their equivalents as set forth in this disclosure. The computer system 1000 may be a mobile device such as a netbook computer. The computer system 1000 may be a mobile device such as a wireless smart phone. The computer system 1000 may be a desktop computer. The computer system 1000 may be a hand-held reader. The computer system 1000 may be a server system. The computer system 1000 may be a supercomputer or high-performance computing system.

In an embodiment, the electronic system 1000 is a computer system that includes a system bus 1020 to electrically couple the various components of the electronic system 1000. The system bus 620 is a single bus or any combination of busses according to various embodiments. The electronic system 1000 includes a voltage source 1030 that provides power to the integrated circuit 1010. In some embodiments, the voltage source 1030 supplies current to the integrated circuit 1010 through the system bus 1020.

The integrated circuit 1010 is electrically coupled to the system bus 1020 and includes any circuit, or combination of circuits according to an embodiment. In an embodiment, the integrated circuit 1010 includes a processor 1012 that can be of any type. As used herein, the processor 1012 may mean any type of circuit such as, but not limited to, a microprocessor, a microcontroller, a graphics processor, a digital signal processor, or another processor. In an embodiment, the processor 1012 includes a semiconductor die packaged with one or more ACIs having metal-density layer units of fractal geometry, as disclosed herein. In an embodiment, SRAM embodiments are found in memory caches of the processor. Other types of circuits that can be included in the integrated circuit 1010 are a custom circuit or an application-specific integrated circuit (ASIC), such as a communications circuit 614 for use in wireless devices such as cellular telephones, smart phones, pagers, portable computers, two-way radios, and similar electronic systems, or a communications circuit for servers. In an embodiment, the integrated circuit 1010 includes on-die memory 1016 such as static random-access memory (SRAM). In an embodiment, the integrated circuit 1010 includes embedded on-die memory 1016 such as embedded dynamic random-access memory (eDRAM).

In an embodiment, the integrated circuit 1010 is complemented with a subsequent integrated circuit 1011. Useful embodiments include a dual processor 1013 and a dual communications circuit 1015 and dual on-die memory 1017 such as SRAM. In an embodiment, the dual integrated circuit 1010 includes embedded on-die memory 1017 such as eDRAM.

In an embodiment, the electronic system 1000 also includes an external memory 1040 that in turn may include one or more memory elements suitable to the particular application, such as a main memory 1042 in the form of RAM, one or more hard drives 1044, and/or one or more drives that handle removable media 1046, such as diskettes, compact disks (CDs), digital variable disks (DVDs), flash memory drives, and other removable media known in the art. The external memory 1040 may also be embedded memory 1048 such as the first die in an embedded TSV die stack, according to an embodiment.

In an embodiment, the electronic system 1000 also includes a display device 1050, an audio output 1060. In an embodiment, the electronic system 1000 includes an input device such as a controller 1070 that may be a keyboard, mouse, trackball, game controller, microphone, voice-recognition device, or any other input device that inputs information into the electronic system 1000. In an embodiment, an input device 1070 is a camera. In an embodiment, an input device 1070 is a digital sound recorder. In an embodiment, an input device 1070 is a camera and a digital sound recorder.

As shown herein, the integrated circuit 1010 can be implemented in a number of different embodiments, including a semiconductor die packaged with one or more ACIs having metal-density layer units of fractal geometry according to any of the several disclosed embodiments and their equivalents, an electronic system, a computer system, one or more methods of fabricating an integrated circuit, and one or more methods of fabricating an electronic assembly that includes a semiconductor die packaged with one or more ACIs having metal-density layer units of fractal geometry according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed semiconductor die packaged with one or more ACIs having metal-density layer units of fractal geometry embodiments and their equivalents. A foundation substrate may be included, as represented by the dashed line of FIG. 10. Passive devices may also be included, as is also depicted in FIG. 10.

References to "one embodiment", "an embodiment", "example embodiment", "various embodiments", etc., indicate that the embodiment(s) so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The following clauses and/or examples pertain to further embodiments or examples. Specifics in the examples may be used anywhere in one or more embodiments. The various features of the different embodiments or examples may be variously combined with some features included and others excluded to suit a variety of different applications. Examples may include subject matter such as a method, means for performing acts of the method, at least one machine-readable medium including instructions that, when performed by a machine cause the machine to performs acts of the method, or of an apparatus or system for facilitating hybrid communication according to embodiments and examples described herein.

Some embodiments pertain to Example 1 that includes a printed circuit board (PCB) comprising a blind via and a discrete component vertically embedded within the blind via.

Example 2 includes the subject matter of Example 1, wherein the discrete component is vertically embedded under a ball grid array coupling the PCB to an integrated circuit (IC) package.

Example 3 includes the subject matter of Examples 1 and 2, wherein the discrete component is a decoupling capacitor.

Example 4 includes the subject matter of Examples 1-3, further comprising a conductive pad layered in the blind via below the discrete component and a solder paste layered over the discrete component.

Although embodiments of the invention have been described in language specific to structural features and/or methodological acts, it is to be understood that claimed subject matter may not be limited to the specific features or acts described. Rather, the specific features and acts are disclosed as sample forms of implementing the claimed subject matter.

What is claimed is:

1. A printed circuit board (PCB) comprising:
   a blind via in a layer of the PCB, the layer of the PCB having an uppermost surface;
   a discrete component vertically embedded within the blind via;
   a solder paste pad on the discrete component, the solder paste pad extending laterally beyond the blind via, wherein a portion of the solder paste pad is vertically overlapping with the uppermost surface of the layer of the PCB; and
   a stencil on the uppermost surface of the layer of the PCB, the stencil laterally surrounding and in lateral contact with the solder paste pad, wherein the discrete component is vertically embedded under a ball grid array coupling the PCB to an integrated circuit (IC) package, and wherein a solder ball of the ball grid array is vertically over and coupled to the discrete component by the solder paste pad.

2. The PCB of claim 1, wherein the discrete component is a decoupling capacitor.

3. The PCB of claim 1, further comprising:
   a conductive pad layered in the blind via below the discrete component.

4. The PCB of claim 1, wherein vertically embedding the discrete component comprises:
   performing a blind via process on the PCB;
   performing an assembly process on the PCB; and
   performing a via-in-pad process on the PCB.

5. The PCB of claim 4, wherein the PCB is a multilayer board, and wherein performing the blind via process comprises:
   producing the multilayer board; and
   performing an ablation process to produce the blind via.

6. The PCB of claim 5, wherein performing the ablation process comprises performing a direct laser ablation.

7. The PCB of claim 5, wherein performing the ablation process comprises performing a combination of a mechanical drill with laser ablation.

8. The PCB of claim 5, wherein performing the assembly process comprises:
   injecting a solder paste into the blind via;
   plugging the discrete component into the blind via;
   applying a solder paste on the top layer of the PCB; and
   performing a reflow to permanently attach the component to the PCB.

9. The PCB of claim 8, wherein the solder paste is injected using a solder jet printer to control a location and an amount of solder paste to be injected.

10. The PCB of claim 8, wherein the solder paste is applied on the PCB by spraying the solder paste on using the stencil.

11. The PCB of claim 8, wherein the solder paste is applied on the PCB by spraying the solder paste using a jet printer.

12. A printed circuit board (PCB) comprising:
   a via connecting an outer layer of the PCB with one or more inner layers of the PCB, wherein an uppermost one of the one or more inner layers has an uppermost surface;
   a discrete component vertically embedded within the via;
   a solder paste pad on the discrete component, the solder paste pad extending laterally beyond the via, wherein a portion of the solder paste pad is vertically overlapping with the uppermost surface of the uppermost one of the one or more layers of the PCB; and
   a stencil on the uppermost surface of the uppermost one of the one or more layers of the PCB, the stencil laterally surrounding and in lateral contact with the solder paste pad, wherein the discrete component is vertically embedded under a ball grid array coupling the PCB to an integrated circuit (IC) package, and wherein a solder ball of the ball grid array is vertically over and coupled to the discrete component by the solder paste pad.

13. The PCB of claim 12, wherein the discrete component is a decoupling capacitor.

14. The PCB of claim 12, further comprising:
a conductive pad layered in the via below the discrete component.

\* \* \* \* \*